(12) United States Patent
Kubota

(10) Patent No.: US 8,178,943 B2
(45) Date of Patent: May 15, 2012

(54) ELECTRICAL FUSE, SEMICONDUCTOR DEVICE AND METHOD OF DISCONNECTING ELECTRICAL FUSE

(75) Inventor: Yoshitaka Kubota, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 187 days.

(21) Appl. No.: 12/453,053

(22) Filed: Apr. 28, 2009

(65) Prior Publication Data
US 2009/0231020 A1 Sep. 17, 2009

(30) Foreign Application Priority Data
Jun. 3, 2008 (JP) ................... 2008-145769

(51) Int. Cl.
*H01L 23/52* (2006.01)
(52) U.S. Cl. ................ 257/529; 257/E23.149; 372/525
(58) Field of Classification Search .................. 372/525; 257/529, E23.149
See application file for complete search history.

(56) References Cited

U.S. PATENT DOCUMENTS

2006/0249808 A1* 11/2006 Hsu et al. ...................... 257/529
2007/0090486 A1 4/2007 Otsuka et al.
2007/0222028 A1 9/2007 Matsuoka et al.

FOREIGN PATENT DOCUMENTS

| CN | 1929125 A | 3/2007 |
| JP | 2007-73576 | 3/2007 |
| JP | 2007-266061 | 10/2007 |

OTHER PUBLICATIONS

Chinese Office Action dated May 21, 2010 with English-language translation.
German Office Action dated Feb. 25, 2011 with an English translation.

* cited by examiner

*Primary Examiner* — Matthew Reames
(74) *Attorney, Agent, or Firm* — McGinn Intellectual Property Law Group, PLLC

(57) ABSTRACT

An electrical fuse including a polysilicon layer; a silicide layer formed over the polysilicon layer; and a first metal contact and a second metal contact arranged over the silicide layer, while being spaced from each other, the electrical fuse being configured so that the silicide layer, after disconnection, is excluded from a region right under the second metal contact, and from a region between the second metal contact and the first metal contact is provided.

16 Claims, 9 Drawing Sheets

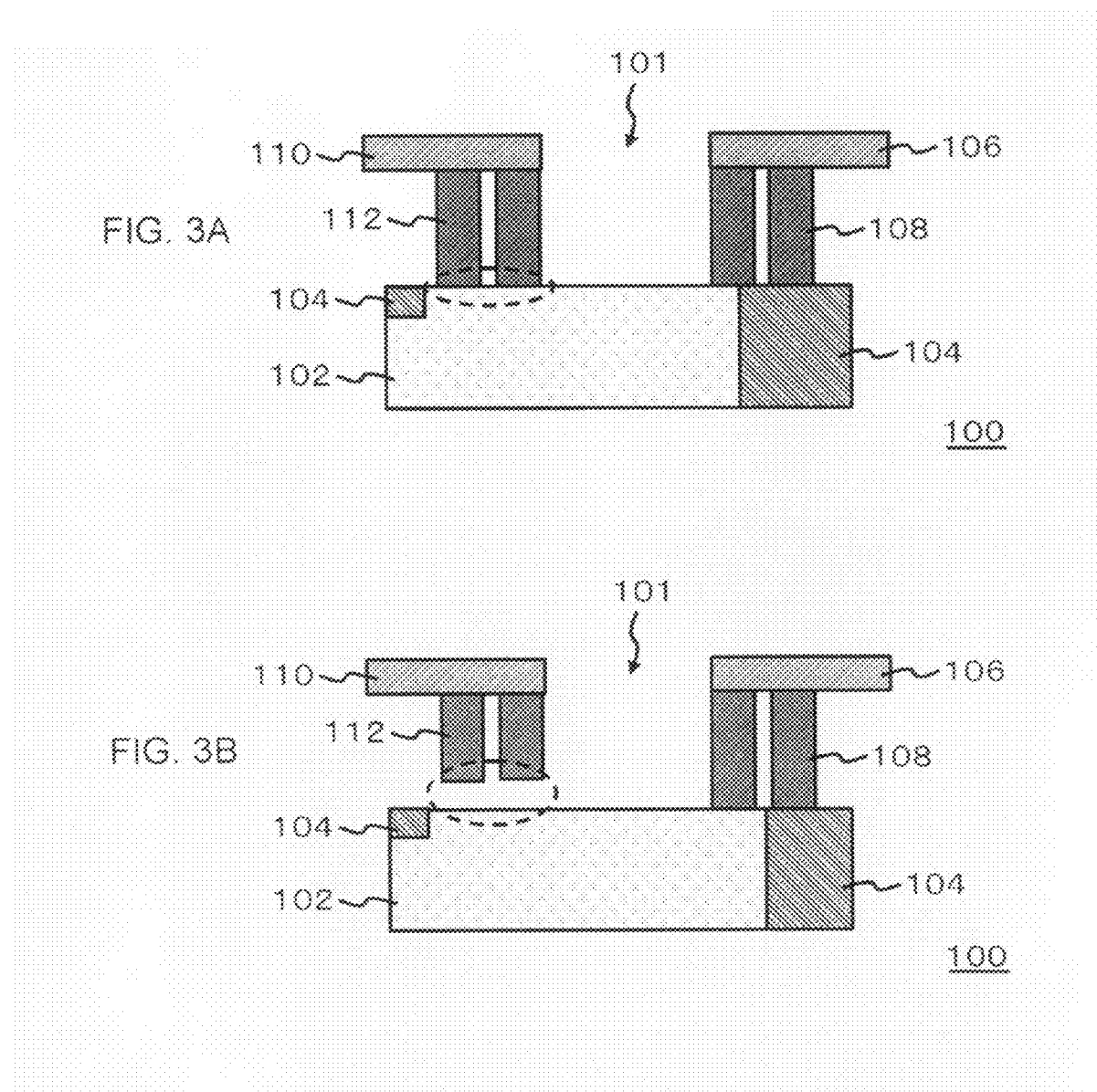

ELECTRICAL FUSE, SEMICONDUCTOR DEVICE AND METHOD OF DISCONNECTING ELECTRICAL FUSE

This application is based on Japanese patent application No. 2008-145769 the content of which is incorporated hereinto by reference.

BACKGROUND

1. Technical Field

The present invention relates to an electrical fuse, a semiconductor device, and a method of disconnecting an electrical fuse.

2. Related Art

There has been known techniques of preliminarily mounting fuses on semiconductor devices, and disconnecting or blowing the fuses in order to adjust resistivity of resistors used for the semiconductor devices, or in order to disconnect any defective elements and replace them with normal elements.

Known methods of disconnecting the fuses include those of irradiating laser to a portion of each fuse, and those of allowing current to flow therethrough.

Japanese Laid-Open Patent Publication No. 2007-266061 describes an electrical fuse (e-fuse) configured to have a silicide layer on a polysilicon layer, wherein a part of the circumferential portion in adjacent to the contact region is configured by a non-silicide region. Since metal atoms may move by electro-migration into the non-silicide region, so that it is described that the electrical fuse once disconnected by electro-migration may be prevented from causing backflow.

Japanese Laid-Open Patent Publication No. 2007-73576 describes a fuse element allowing at least a portion of a metal material, which composes a metal silicide layer formed over a silicon layer, to move to one contact portion side after disconnection, and allowing the other contact portion to connect with the silicon layer.

According to the method described in Japanese Laid-Open Patent Publication No. 2007-266061, the silicide layer is disconnected only by a mild electro-migration, so that the method is none other than disconnecting the silicide layer, while remaining the contacts and the silicide layer in connection with each other. The method was therefore only to produce small changes in the resistivity between the states before and after the disconnection of fuse, and to make judgment only to a limited degree of accuracy. On the other hand, Japanese Laid-Open Patent Publication No. 2007-73576 describes a configuration allowing the contact to connect with the silicon layer after the disconnection. Since the contact in this configuration is connected with the silicide layer before the disconnection, and is connected with the silicon layer after the disconnection, so that the fuse may supposedly be increased in changes in the resistivity between the states before and after the disconnection. The method described in Japanese Laid-Open Patent Publication No. 2007-73576 is, however, still none other than allowing a metal material composing the silicide layer to cause only a narrow portion of disconnection by a mild electro-migration, so that disconnected portion may be anticipated to recover connection, due to migration of the silicide layer. Also this configuration has, therefore, been suffering from a problem of only a limited degree of accuracy in judgment.

SUMMARY

According to the present invention, these is provided an electrical fuse including: a polysilicon layer; a silicide layer formed over the polysilicon layer; and a first metal contact and a second metal contact arranged over the silicide layer, while being spaced from each other, the electrical fuse being configured so that, before disconnection, the first metal contact and the second metal contact are connected to the silicide layer and after disconnection, the silicide layer is excluded from a region right under the second metal contact, and from a region between the second metal contact and the first metal contact.

According to the present invention, there is provided also a semiconductor device including an electrical fuse which contains a substrate; a polysilicon layer formed over the substrate; a silicide layer formed over the polysilicon layer; and a first metal contact and a second metal the silicide layer arranged over the silicide layer, while being spaced from each other, the electrical fuse being configured so that, before disconnection, the first metal contact and the second metal contact are connected to the silicide layer and after disconnection, the silicide layer is excluded from a region right under the second metal contact, and from a region between the second metal contact and the first metal contact.

According to the present invention, there is provided still also a method of disconnecting an electrical fuse which includes a polysilicon layer, a silicide layer formed over the polysilicon layer; and a first metal contact and a second metal contact arranged over the silicide layer, while being spaced from each other, the method including: allowing current to flow between the first metal contact and the second metal contact so as to induce migration of the silicide layer from a region right under the second metal contact, and from a region between the second metal contact and the first metal contact, towards the first metal contact, thereby excluding the silicide layer from the region right under the second metal contact, and from the region between the second metal contact and the first metal contact.

The electrical fuse herein is configured so as to be disconnected by allowing current to flow between the first metal contact and the second metal contact, as a result of migration of the silicide layer from the region right under the second metal contact towards the first metal contact, so as to exclude itself from the region right under the second metal contact, and as a result of stuffing of the silicide layer into the region right under the first metal contact. The silicide layer further migrates to a position away from the second metal contact beyond the region right under the first metal contact, so as to exclude itself also from the region between the first metal contact and the second metal contact. As a consequence, the silicide layer migrates far beyond the first metal contact, as viewed from the position of the second metal contact.

By virtue of this configuration, changes in the resistivity of the fuse between the states before and after the disconnection may be made more distinctive, and possibility of re-connection may be reduced, so that the state of disconnection of fuse may be judged in a more accurate manner.

Note that also any arbitrary combinations of the above-described constituents, and any exchanges of expressions of the present invention among the method, the device and so forth may be effective as embodiments of the present invention.

According to the present invention, the state of disconnection of fuse may be judged in an accurate manner.

BRIEF DESCRIPTION OF THE DRAWINGS

The above and other objects, advantages and features of the present invention will be more apparent from the following description of certain preferred embodiments taken in conjunction with the accompanying drawings, in which:

FIGS. 3A and 3B are sectional views illustrating states of disconnection of the electrical fuse in one embodiment of the present invention;

DETAILED DESCRIPTION

Figure 8:
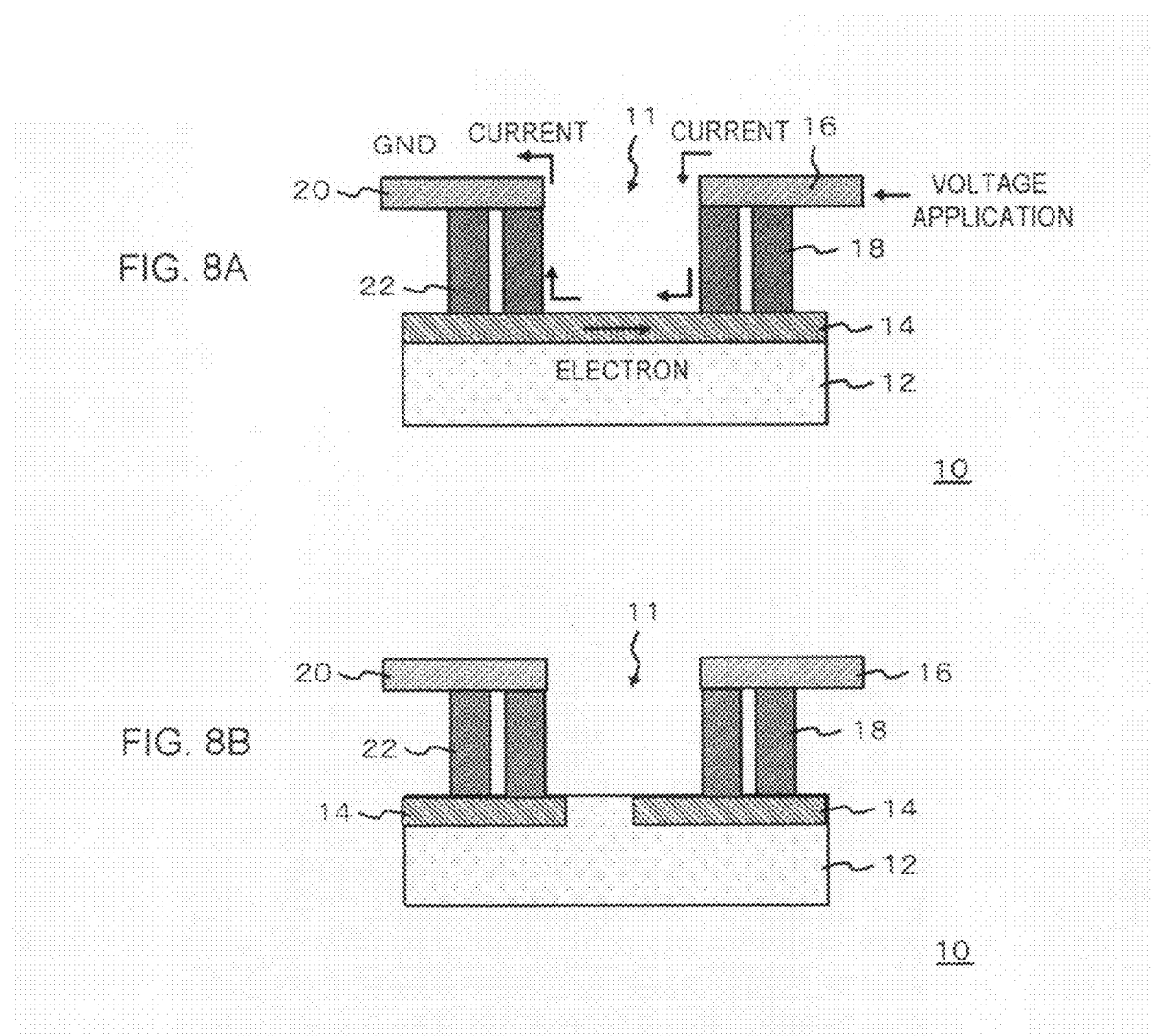
FIGS. 8A and 8B are sectional views explaining procedures for disconnecting an electrical fuse in a conventional electrical fuse.

Before describing of the present invention, the related art will be explained in detail with reference to FIGS. 8A and 8B in order to facilitate the understanding of the present invention.

One known exemplary electrical fuse disconnected by current is such as making use of electro-migration caused by migration of metal atoms in a silicide layer. FIGS. 8A and 8B illustrate a mechanism of disconnection of an electrical fused composed of a silicide layer. FIG. 8A illustrate a state before disconnection. A silicide layer 14 herein is formed over a polysilicon layer 12, and contacts 18 and contacts 22 are formed over the silicide layer 14. The contacts 18 are connected to an interconnect 16, and the contacts 22 are connected to an interconnect 20. These components configure an electrical fuse 11. In this state, the contacts 18 and the contacts 22 are connected to the silicide layer 14. When current is allowed to flow through thus-configured electrical fuse 11 from the interconnect 16 towards the interconnect 20, the current flows sequentially through the interconnect 16, the contacts 18, the silicide layer 14, the contacts 22 and the interconnect 20. Electrons herein flow from the interconnect 20 towards the interconnect 16. More specifically, the electrons migrates in the silicide layer 14 from the left to the right of the drawing. The silicide layer 14, therefore, migrates towards the contacts 18 as illustrated in FIG. 8B, and thereby the silicide layer 14 is disconnected. The current expected to flow in the direction from the interconnect 16 to the interconnect 20 can now flow through the polysilicon layer 12. As a consequence, resistivity of a region between the contacts 18 and the contacts 22 varies, and thereby disconnection of the electrical fuse 11 may be judged.

The invention will now be described herein with reference to illustrative embodiments. Those skilled in the art will recognize that many alternative embodiments can be accomplished using the teachings of the present invention and that the invention is not limited to the embodiments illustrated for explanatory purposes.

Embodiments of the present invention will be explained below, referring to the attached drawings. Note that, in all drawings, any similar constituents will be given with similar numerals, and explanations therefor will not be repeated.

Figure 1:
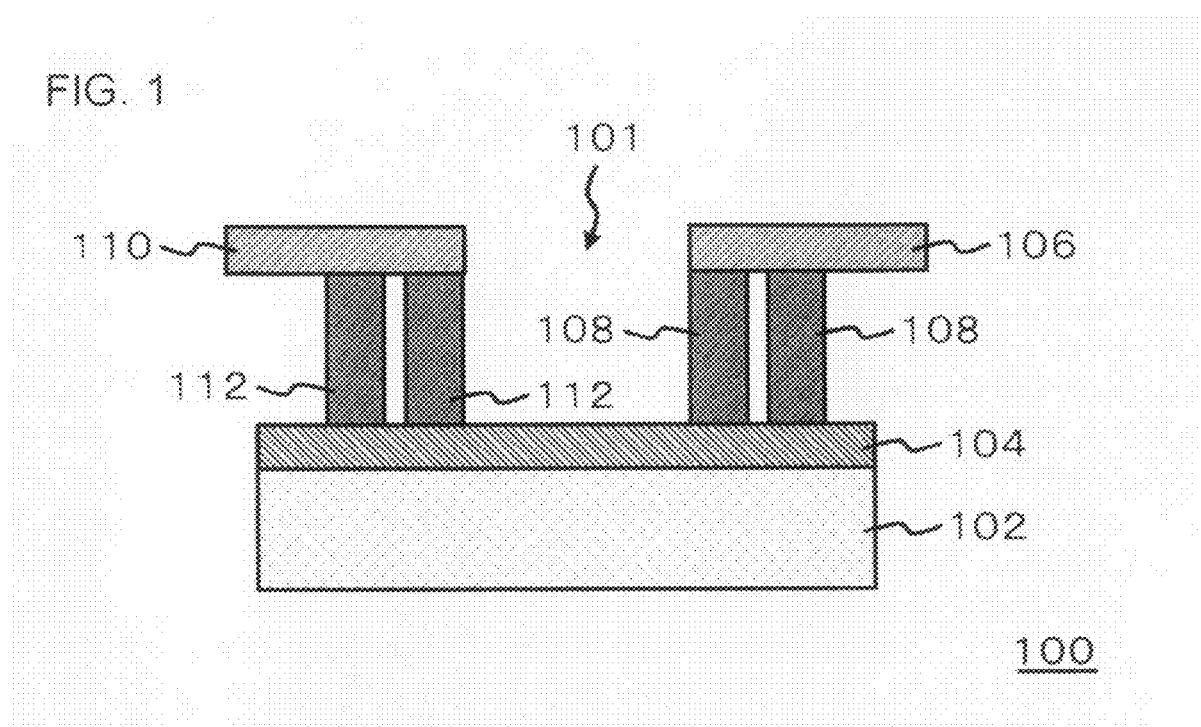
FIG. 1 is a sectional view illustrating a configuration of a semiconductor device of one embodiment of the present invention.

FIG. 1 is a sectional view illustrating a configuration of a semiconductor device 100 in one embodiment of the present invention.

The semiconductor device 100 contains a substrate (not illustrated) such as a silicon substrate, a polysilicon layer 102 formed thereon, a silicide layer 104 formed on the polysilicon layer 102, first metal contacts 108 and second metal contacts 112 arranged over the silicide layer 104 while being spaced from each other, a first interconnect 106 formed over the first metal contacts 108, and a second interconnect 110 formed over the second metal contacts 112. The first interconnect 106, the first metal contacts 108, the silicide layer 104, the polysilicon layer 102, the second metal contacts 112, and the second interconnect 110 herein compose an electrical fuse 101. FIG. 1 is a drawing illustrating a state before the electrical fuse 101 is disconnected.

The first metal contacts 108 and the second metal contacts 112 may be configured using, for example, a Ti/TiN barrier metal and a tungsten. The first metal contacts 108 and the second metal contacts 112 are respectively connected to the silicide layer 104. The silicide layer 104 may be configured typically by nickel silicide, cobalt silicide, titanium silicide or the like. The first interconnect 106 is connected to the first metal contacts 108. The second interconnect 110 is connected to the second metal contacts 112.

Figure 2:
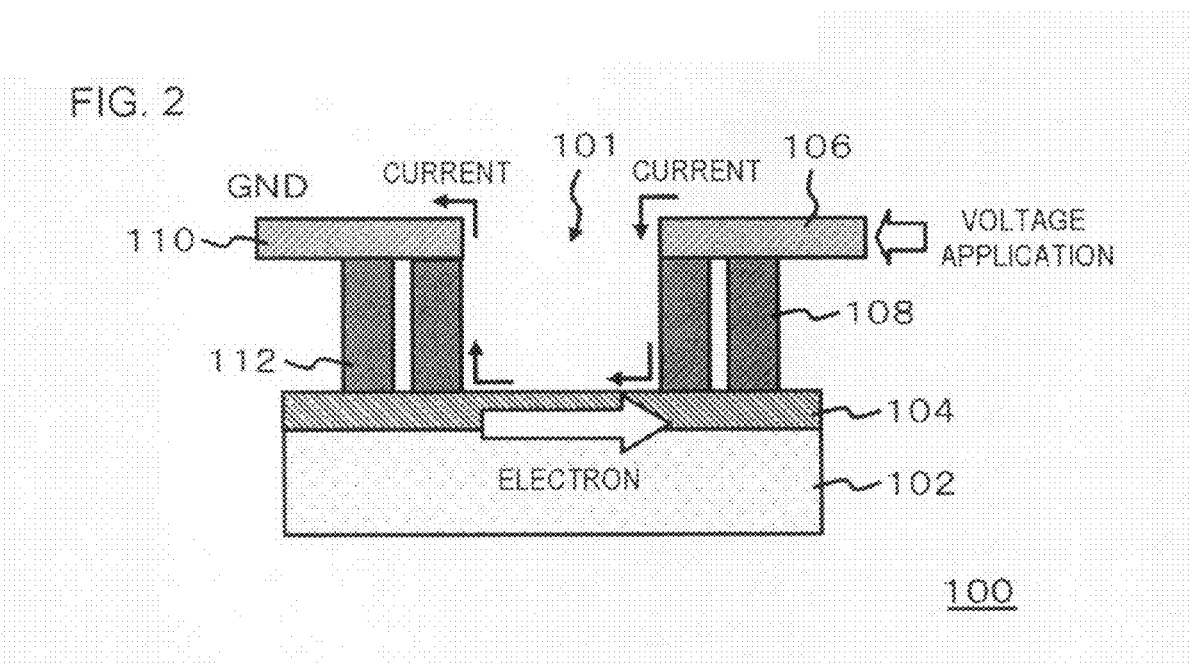
FIG. 2 is a sectional view explaining a procedure of disconnecting the electrical fuse in one embodiment of the present invention.

FIG. 2 is a drawing illustrating a procedure of disconnecting the electrical fuse 101 by allowing current to flow therethrough.

A high voltage is applied to the interconnect 106, while grounding the second interconnect 110, and current is allowed to flow from the first interconnect 106 to the second interconnect 110. The current therefore flows sequentially through the first interconnect 106, the first metal contacts 108, the silicide layer 104, the second metal contacts 112, and the second interconnect 110. Since electrons flow in the direction opposite to the direction of current flow, the electrons flow also in the silicide layer 104 in the direction from the second metal contact 112 to the first metal contacts 108. In this embodiment, the current for disconnection of the electrical fuse 101 is set larger than usual. Therefore, the silicide layer 104 rapidly moves with the flow of electrons. By applying an excessive power like this, the silicide layer 104 rapidly moves towards the first metal contacts 108, and consequently exclude itself from the region right under the second metal contacts 112, and from the region between the second metal contacts 112 and the first metal contacts 108.

FIG. 3A is a drawing illustrating a state where a portion of the silicide layer 104 right under the second metal contacts 112 migrates towards the first metal contacts 108, to thereby bring the second metal contacts 112 into direct contact with the polysilicon layer 102. In this process, the mode of contact accomplished between the second metal contact 112 and the silicide layer 104, at a portion surrounded by the broken line circle in the drawing, is ohmic contact before the disconnection, but turns into Schottky contact after the disconnection, so that changes in the resistivity of the electrical fuse 101, before and after the disconnection, may be made distinctive. The configuration is also advantageous in view of preventing the re-connection, since the silicide layer 104 is stuffed to the region right under the first metal contacts 108 so as to exclude itself from the region between the first metal contacts 108 and the second metal contacts 112.

FIG. 3B is a drawing illustrating a state where not only a portion of the silicide layer 104 right under the second metal contacts 112 migrates toward the first metal contacts 108, but also lower portions of the second metal contacts 112 migrates together towards the first metal contacts 108. As a result of migration of the lower portions of the second metal contacts 112 towards the first metal contacts 108, the second metal contacts 112 are now electrically disconnected from the silicide layer 104 and the polysilicon layer 102. The electrical fuse 101 herein is in a completely disconnected state at a portion surrounded by the broken line circle in the drawing, so that changes in the resistivity of the electrical fuse 101, before and after the disconnection, may be made distinctive also in this case.

By virtue of this configuration, the resistivity of the electrical fuse 101 after the disconnection may be raised up to $1 \times 10^2$ times or more as large as the resistivity before the disconnection.

Figure 4A:
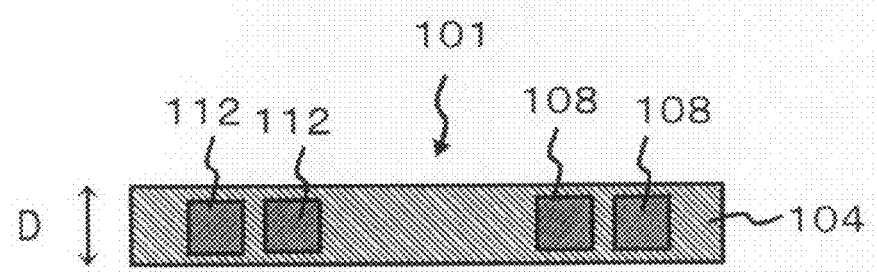
FIGS. 4A and 4B are plan views illustrating configurations of the electrical fuse in one embodiment of the present invention.
Figure 4B:
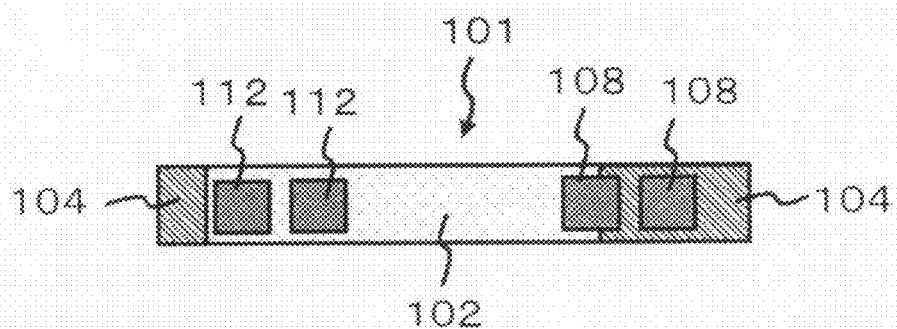

FIGS. 4A and 4B are plan views illustrating configurations of the electrical fuse of this embodiment, where FIG. 4A illustrates a state before the disconnection, and FIG. 4B illustrates a state after the disconnection.

In this embodiment, the first metal contacts 108 and the second metal contacts 112 are provided respectively on one end and the other end of an oblong rectangular silicide layer 104. More specifically, the silicide layer 104 has a substantially constant width D at the regions where the first metal contacts 108 and the second metal contacts 112 are formed and the region therebetween. By virtue of this configuration, the silicide layer 104 may more readily be excluded, in the process of disconnection of the electrical fuse 101, from the region right under the second metal contact 112. The number of provision of the first metal contacts 108 and the second metal contacts 112, exemplified as two in the above, is not specifically limited.

Figure 5:
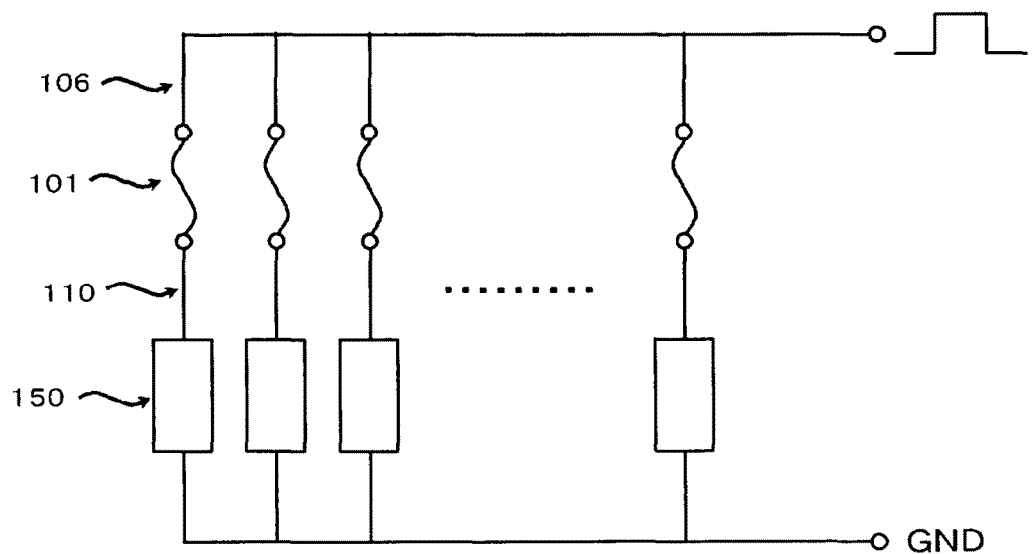
FIG. 5 is a schematic drawing illustrating a configuration of the semiconductor device in one embodiment of the present invention.

FIG. 5 is a schematic drawing illustrating a configuration of the semiconductor device in one embodiment of the present invention.

Each second interconnect 110 of the semiconductor device 100 is connected to one end of each judging circuit 150. The other end of each judging circuit 150 is grounded. Each first interconnect 106 is connected to a power line. The judging circuit 150 herein may be configured to judge the disconnection of the electrical fuse 101 when the resistivity after the disconnection is found to be $1 \times 10^2$ times or more as large as the resistivity before the disconnection.

Figure 9:
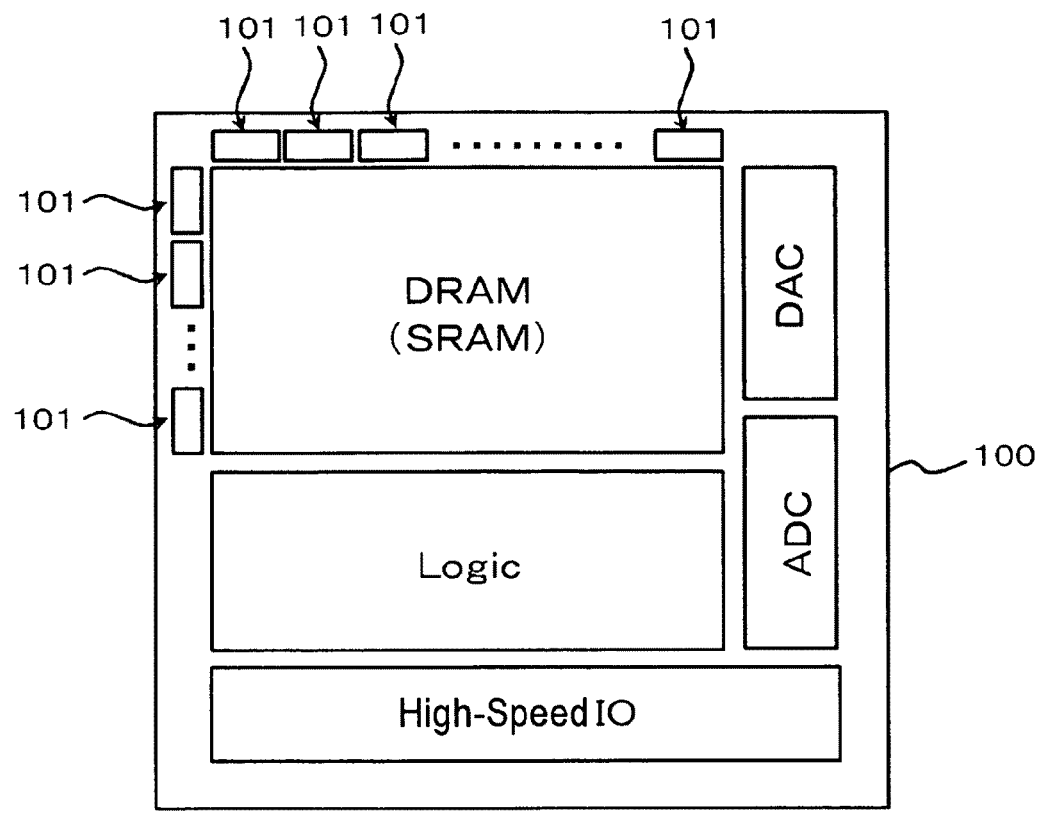
FIG. 9 is a block diagram illustrating a configuration of the semiconductor device containing the electrical fuse according to one embodiment of the present invention.

FIG. 9 is a block diagram illustrating a configuration of the semiconductor device 100 (semiconductor chip) containing the electrical fuse 101 of this embodiment.

On the semiconductor chip, there are provided a memory region such as composed of a DRAM (Dynamic Random Access Memory) or SRAM (Static Random Access Memory); a logic region (Logic); a DAC (Digital Analog Converter); an ADC (Analog Digital Converter); a high-speed IO, and so forth. In the periphery of the memory region composed of DRAM or SRAM, there are provided a plurality of electrical fuses 101 aimed at activating redundant bits in place of faulty bits. Operations of the semiconductor device 100 is confirmed after completion of the wafer processes, and any faulty bit detected herein is replaced with a redundant bit, by disconnecting any electrical fuse 101 connected to the detected faulty bit. As a consequence, the semiconductor device 100 contains disconnected/blown electrical fuses 101 and connected/intact electrical fuses 101 mixed therein.

EXAMPLES

The semiconductor device 100 configured as illustrated in FIG. 1 was formed, and current was allowed to flow between the first interconnect 106 and the second interconnect 110 so as to disconnect/blow the fuse. In Example 1, current, approximately three times as large as that supplied in Example 2, was supplied in order to disconnect the fuse.

Figure 6:
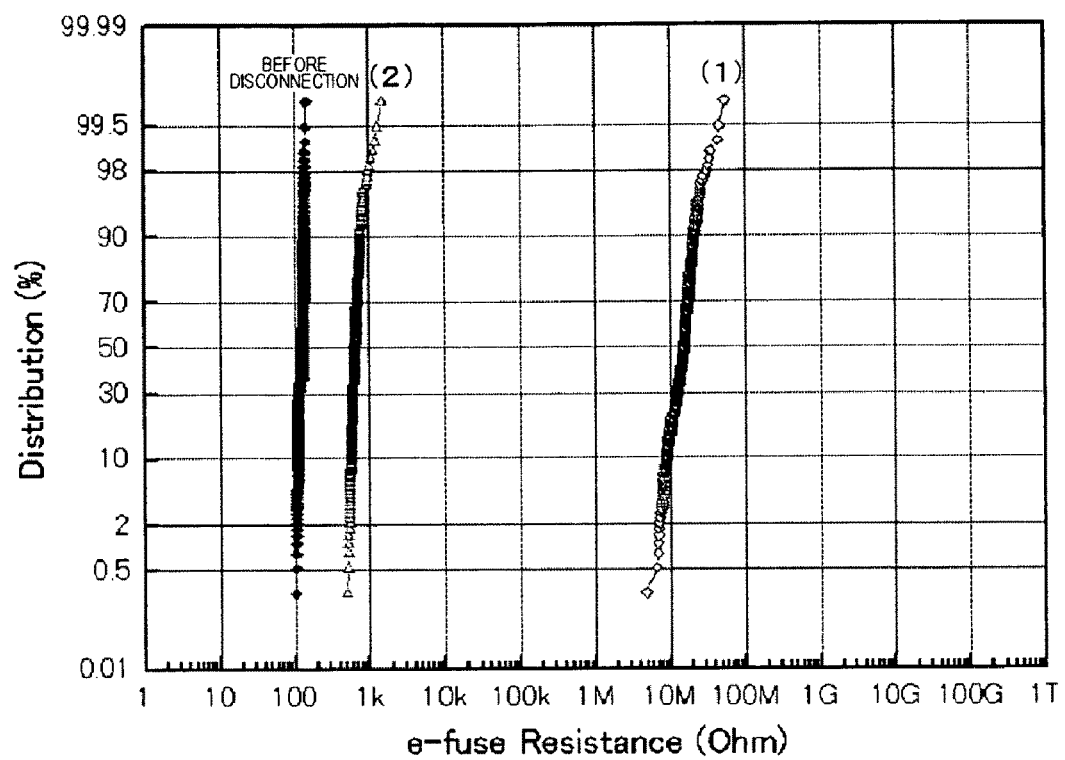
FIG. 6 is a drawing illustrating resistivity of an electrical fuse before being disconnected, and after disconnected under varying conditions.

FIG. 6 is a drawing illustrating resistivity of the electrical fuse 101 before the disconnection, and resistivity of those after the disconnection in Example 1 and Example 2. It was found that the resistivity of the electrical fuse 101 before the disconnection was approximately 100 Ω, whereas the resistivity raised, after the disconnection under the condition of Example 1, to as high as approximately 10 MΩ, proving an increase by approximately $1 \times 10^5$ times or around, as compared with the resistivity before the disconnection. On the other hand, the resistivity, observed after the disconnection under the condition of Example 2, was approximately 1 kΩ or around, proving an increase only by approximately 10 times, as compared with the resistivity before the disconnection.

Figure 7:
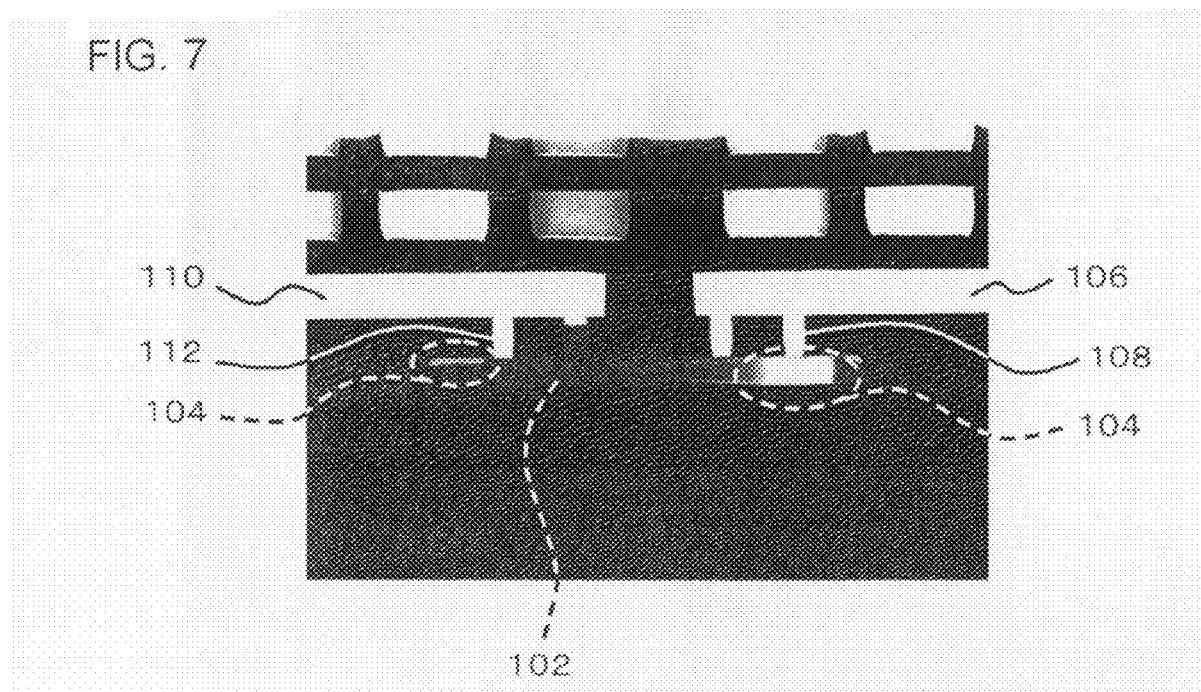
FIG. 7 is a sectional view showing a configuration of the semiconductor device having the electrical fuse disconnected under the condition of Example 1.

FIG. 7 is a sectional view showing a configuration of the semiconductor device 100 having the electrical fuse 101 disconnected under the condition of Example 1.

In the drawing, the bright portions indicate the metal. In the drawing, the portions surrounded by the broken line circles indicate the silicide layer 104. As is clear from the drawing, the electrical fuse 101 is configured to allow the silicide layer 104 to exclude itself from the region right under the second metal contacts 112, and from the region between the second metal contacts 112 and the first metal contacts 108, after being applied with an excessive power. It is also apparent that the silicide layer 104 is stuffed into the region right under the first metal contacts 108.

The embodiments of the present invention, having been described in the above referring to the attached drawings, are only for exemplary purposes, allowing adoption of also various configurations other than those described in the above.

It is apparent that the present invention is not limited to the above embodiment, that may be modified and changed without departing from the scope and spirit of the invention.

What is claimed is:

1. An electrical fuse, comprising:
   a polysilicon layer;
   a silicide layer formed over said polysilicon layer;
   a first metal contact and a second metal contact arranged over said silicide layer, while being spaced from each other; and
   a control circuit configured to selectively cause a disconnection to occur by applying a high voltage to the first contact while a ground is applied to the second contact to thereby cause a rapid movement of the silicide layer from under the second metal contact such that,
   before said disconnection, said first metal contact and said second metal contact are connected to said silicide layer, and after said disconnection, said silicide layer is excluded from a region directly under said second metal contact and from a region between said second metal contact and said first metal contact.

2. The electrical fuse as claimed in claim 1, wherein said electrical fuse is configured so that, after said disconnection, said second metal contact is connected to said polysilicon layer while being disconnected from said silicide layer.

3. The electrical fuse as claimed in claim 1, wherein said electrical fuse is configured so that, after said disconnection, said second metal contact is electrically disconnected from said silicide layer and said polysilicon layer.

4. The electrical fuse as claimed in claim 1, wherein said electrical fuse is configured to have a resistivity value after disconnection that is equal to or greater than $1\times10^2$ times as a resistivity value before said disconnection.

5. The electrical fuse as claimed in claim 2, wherein said electrical fuse is configured to have a resistivity value after disconnection that is equal to or greater than $1\times10^2$ times as a resistivity value before said disconnection.

6. The electrical fuse as claimed in claim 3, wherein said electrical fuse is configured to have a resistivity value after disconnection that is equal to or greater than $1\times10^2$ times as a resistivity value before said disconnection.

7. A semiconductor device, comprising:
an electrical fuse comprising a substrate;
a polysilicon layer formed over said substrate;
a silicide layer formed over said polysilicon layer;
a first metal contact and a second metal contact, said first metal contact and said second metal contact being arranged over said silicide layer, while being spaced from each other; and
a control circuit configured to selectively cause a disconnection to occur by applying a high voltage to the first metal contact while a ground is applied to the second metal contact to thereby cause a rapid movement of the silicide layer from under the second metal contact such that, before said disconnection, said first metal contact and said second metal contact are connected to said silicide layer, and by providing, after said disconnection, said silicide layer is excluded from a region directly under said second metal contact and from a region between said second metal contact and said first metal contact.

8. The semiconductor device as claimed in claim 7, further comprising a judging circuit judging whether said electrical fuse is disconnected or not,
wherein said judging circuit judges that said electrical fuse is disconnected if a resistivity value after said disconnection is equal to or greater than $1\times10^2$ times a resistivity value before disconnection.

9. The electrical fuse as claimed in claim 1, further comprising:
a first interconnect electrically associated with the first contact; and
a second interconnect electrically associated with the second contact.

10. The electrical fuse as claimed in claim 9, wherein said disconnection is configured to occur when a high voltage is applied to the first interconnect while a ground is applied to the second interconnect.

11. A semiconductor device, comprising:
a polysilicon layer;
a first contact;
a second contact spaced apart from the first contact;
a silicide layer formed on the polysilicon layer configured as an oblong rectangle, said silicide layer comprising a constant width at a first region where the silicide layer contacts the first contact and at a second region under the second contact, the silicide layer being configured to migrate as a result of a large current applied to the first contact and to be excluded from the second region; and
a control circuit configured to selectively cause a disconnection to occur by, before said disconnection, applying the large current to the first contact while a ground is applied to the second contact to thereby cause the migration of the silicide layer from the second region, and, after said disconnection, said silicide layer is excluded from the second region.

12. The semiconductor device of claim 11, wherein the silicide layer comprises one of a nickel silicide, a cobalt silicide, and a titanium silicide.

13. The semiconductor device of claim 11, wherein the silicide layer is configured to migrate as a result of the large current to be excluded from a region between the first contact and the second contact.

14. The semiconductor device of claim 11, wherein the silicide layer is configured to migrate toward the first contact when the large current is applied to the first contact.

15. The semiconductor device of claim 11, wherein the second contact and the silicide layer are configured to be in ohmic contact with the silicide layer before the large current is applied and the second contact and the silicide layer are configured to be in Schottky contact after the large current is applied.

16. The semiconductor device of claim 11, wherein a lower portion of the second contact is configured to migrate towards the first contact when the large current is applied to the first contact.

* * * * *